United States Patent [19]

Mastroianni

[11] Patent Number: 4,830,973
[45] Date of Patent: May 16, 1989

[54] MERGED COMPLEMENTARY BIPOLAR AND MOS MEANS AND METHOD

[75] Inventor: Sal Mastroianni, Tempe, Ariz.

[73] Assignee: Motorola, Inc., Schaumburg, Ill.

[21] Appl. No.: 105,161

[22] Filed: Oct. 6, 1987

[51] Int. Cl.[4] .......................................... H01L 21/265
[52] U.S. Cl. ....................................... 437/31; 437/56;
     437/34; 437/59; 357/34; 357/43; 148/DIG. 9
[58] Field of Search ........................ 437/31, 32, 33, 56,
     437/59, 34, 54, 81, 41, 187; 148/DIG. 10, DIG.
     11, DIG. 9; 397/34, 43, 46

[56] References Cited

U.S. PATENT DOCUMENTS

| | | |
|---|---|---|
| 3,370,995 | 2/1968 | Lowery . |
| 3,648,128 | 3/1972 | Kobayashi . |
| 4,311,532 | 1/1982 | Taylor . |
| 4,362,574 | 12/1982 | Gevandyan ............................ 437/59 |
| 4,378,630 | 4/1983 | Horng . |
| 4,402,003 | 8/1983 | Blanchard ............................. 357/46 |
| 4,546,370 | 10/1985 | Curran .................................. 357/43 |
| 4,577,397 | 3/1986 | Komatsu . |
| 4,583,106 | 4/1986 | Anantha . |
| 4,589,004 | 3/1986 | Yasuda . |
| 4,593,459 | 6/1986 | Poppert . |
| 4,599,789 | 7/1986 | Gasner . |
| 4,639,761 | 1/1987 | Singer et al. ......................... 357/43 |
| 4,646,124 | 2/1987 | Zunino ................................. 357/43 |
| 4,729,007 | 3/1988 | Coe ...................................... 357/46 |

OTHER PUBLICATIONS

Zollo, S. *Electronics* 7/24/86, pp. 97–101.

*Primary Examiner*—Brian E. Hearn
*Assistant Examiner*—Kevin McAndrews
*Attorney, Agent, or Firm*—Robert M. Handy

[57] ABSTRACT

A means and method for forming improved merged complementary bipolar, complementary MOS (CBIC-MOS) structures is described. The N-channel and N-base devices are grouped in a first isolated semiconductor region and the P-channel and P-base devices are grouped in a second isolated semiconductor region. The two regions are separated by lateral isolation. By sharing internal device regions and arranging the internal device regions in the proper sequence a particularly compact structure is obtained which may be wired to implement a variety of CBICMOS circuits using a single wiring layer. Both CMOS and vertical NPN and PNP bipolar devices are produced in a common substrate by a common process.

16 Claims, 6 Drawing Sheets

MERGED COMPLEMENTARY BIPOLAR AND MOS MEANS AND METHOD

BACKGROUND OF THE INVENTION

This application relates, in general, to semiconductor devices and, more particularly, to improved means and method for providing merged complementary bipolar and complementary MOS devices in an integrated circuit. As used herein the word "CBICMOS" is intended to refer to integrated complementary bipolar and complementary MOS devices.

MOS devices (MOSFETS) and bipolar devices have desirable but different characteristics. The wafers, masks and processes sequences for forming MOS and bipolar devices are, in general, different. Processes and structures for forming complementary MOS devices (CMOS) on the same semiconductor wafer are well known in the art. Also, processes and structures for forming BIMOS devices, that is CMOS and NPN bipolar devices, on the same wafer are known. Other processes and structures for forming complementary (NPN and PNP) bipolar devices on the same wafer are also known. However, satisfactory processes and structures for forming complementary MOS and complementary bipolar devices (CBICMOS) on the same wafer have not been available in the prior art. It is especially difficult to form CBICMOS devices on the same wafer in a space economical and process compatible fashion. A need continues to exist for integrated CBICMOS devices because of the great advantage that such devices can provide for implementation of high speed, low power complex integrated circuits.

Accordingly, it is an object of the present invention to provide an improved means and method for complementary bipolar and complementary MOS devices in a common substrate where the devices are merged in a space economical manner.

It is a further object of the present invention to provide an improved means and method for forming CBICMOS devices on a common substrate by a common sequence of masks and process steps.

It is a still further object of the present invention to provide an improved means and method for forming CBICMOS devices on a common substrate where the N and P type devices are laterally isolated but so arranged as to be readily interconnectable by a single conductor layer.

SUMMARY OF THE INVENTION

The foregoing and other objects and advantages are provided by the method and structure of the present invention. A CBICMOS device is provided comprising a substrate having laterally isolated first and second semiconductor regions; a first MOS transistor having source, drain and channel of a first type in the first region; a first bipolar transistor having a base of the first type and emitter and collector of opposite second type in the first region; a second MOS transistor having source, drain and channel of the second type in the second region; and a second bipolar transistor having a base of the second type and emitter and collector of the first type in the second region.

The source of the MOS transistor in each region is desirably shorted to a collector contact in the same region, and the drain of each MOS transistor is desirably coupled or merged with the base of the bipolar transistor in the same region. A first conductor is desirably used to tie together the gates of the first and second MOS transistors, a second conductor interconnects the emitters of the first and second bipolar transistors, and a third conductor ties together the merged base-drain in the first region with the merged base-drain in the second region. The first conductor desirably also forms an input and the third conductor desirably forms an output. Multiple inputs are obtained, for example a two input NOR gate, by providing parallel MOS input devices (e.g., P-channel) in one region and series MOS input devices (e.g., N-channel) in the other region, and wherein, for example, the gate of each N-channel device is connected to the gate of a corresponding P-channel device, with each such N-P pair forming an input.

The above-described structure and others are formed by providing a substrate having first and second semiconductor regions separated by an isolation means, e.g., a lateral dielectric isolation wall, wherein the first and second semiconductor regions are intrinsic or of a lightly doped first conductivity type and extend to the semiconductor surface, wherein the first region has a more heavily doped first portion of the first conductivity type separated from the surface and the second region has a more heavily doped first portion of an opposite second conductivity type separated from the surface; then in either order (i) forming in the second region a second portion of the second type extending to the surface and (ii) locating in the first region, second and third portions of the first type in contact with the first portion of the first region and extending to the surface and spaced apart by part of the first region and, in the second region, a third portion of the first type in contact with the first portion of the second region and extending to the surface, wherein if the first and second regions are intrinsic the second and third portions of the first region and the third portion of the second region are provided by doping, wherein if the first and second regions are of the first type, the second and third portions of the first region and the third portion of the second region are, respectively, part of the first and second regions; forming in both the first and second regions, fourth and fifth spaced-apart portions of the second type extending to the surface wherein the fifth portion of each region is separated from the first portion of each region by part of the third portion of each region; forming in both the first and second regions, sixth and seventh spaced-apart portions of the first type extending to the surface, wherein in the first region the sixth and seventh portions extend into the part of the first region separating the second and third portions of the first region and wherein in the second region the sixth and seventh portions extend into the second portion of the second region; and providing on or above the surface a first conductor interconnecting the fifth portion of the first region and the seventh portion of the second region and a second conductor interconnecting the fifth portion of the second region and the seventh portion of the first region.

The isolation means is conveniently provided by etching a trench in the substrate between the first and second regions and filling the trench with a material which electrically isolates the first and second regions of the substrate, but other isolation means may also be used.

In a preferred embodiment, the second and third portions of the first region and the third portion of the second region are formed simultaneously either by doping where the first and second regions are formed initially of intrinsic material or as part of the first and second regions where these regions are formed initially of lightly doped material of the first type. It is further desirable to form both the fourth and fifth portions in both the first and second regions simultaneously. Additionally, it is desirable to form both the sixth and seventh portions of both the first and second regions simultaneously. The isolation wall is preferably provided prior to forming the second portions.

A more complete understanding of the present invention along with further advantages thereof can be attained from the following description in conjunction with the accompanying drawings.

DETAILED DESCRIPTION OF THE DRAWINGS

The CBICMOS structures and processes of the present invention are described in terms of device regions of particular conductivity types. However, these are intended merely for purposes of explanation and are not intended to be limiting. Those of skill in the art will appreciate, for example, that devices and circuits of opposite type may be constructed by changing N for P and vice versa in the various figures and description. Those of skill in the art will also appreciate that while particular combinations of P and N are illustrated, based on the teachings herein other combinations of P and N consistent with the objectives of implementing CBICMOS circuits can also be provided.

Figure 1A:
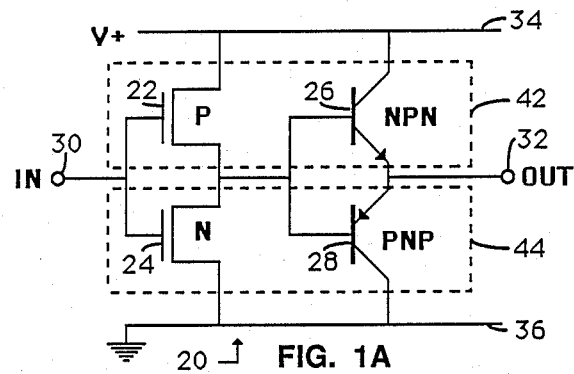
FIG. 1A is an electrical circuit schematic of a single input CBICMOS circuit and FIG. 1B an electrical circuit schematic of a dual input CBICMOS circuit.
Figure 1B:
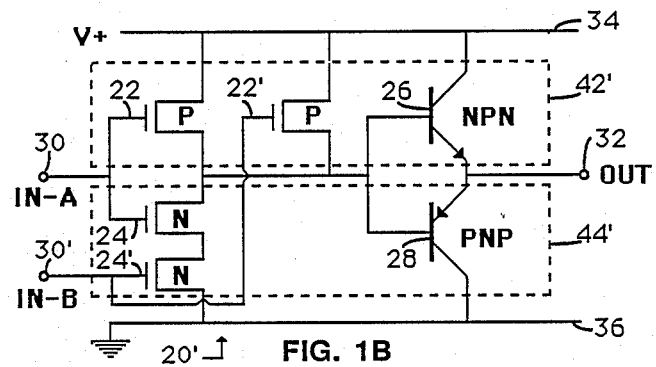

FIGS. 1A-B show electrical circuit schematics of, respectively, a single input CBICMOS arrangement (circuit 20) and a dual input CBICMOS arrangement (circuit 20'). Circuit 20 of FIG. 1A comprises input 30, P-channel MOSFET 22, N-channel MOSFET 24, NPN bipolar transistor 26, PNP bipolar transistor 28, output 32, power rail 34 and ground rail 36. Dashed outlines 42, 44 indicate how the components of circuit 20 are grouped within two isolated semiconductor regions. This grouping within isolated semiconductor regions 42, 44 prevents interaction between the closely spaced integrated devices which would cause latch-up and other difficulties.

Circuit 20' of FIG. 1B is similar to circuit 20 of FIG. 1A but arranged for dual inputs. The same identification numbers are used for the same components. Circuit 20' has additional P-channel transistor 22' in parallel with transistor 22 and additional N-channel transistor 24' in series with transistor 24. The gates of the P and N channel devices are coupled together in pairs, the gates of the first P-N pair (e.g., 22, 24) forming input 30 and the gates of the second P-N pair (e.g., 22', 24') forming input 30'. Dashed outlines 42', 44' indicate how the components of circuit 20' are grouped into isolated semiconductor regions. In both circuits the N-channel MOSFET or MOSFETS are grouped with the PNP device and the P-channel MOSFET or MOSFETS are grouped with the NPN device. The circuit of FIG. 1B provides a two input NOR gate. Those of skill in the art will understand based on the teachings herein that the two input NOR gate circuit is merely intended to be exemplary and that gates having more than two inputs and other logic functions of two or more inputs can also be implemented.

Figure 2:
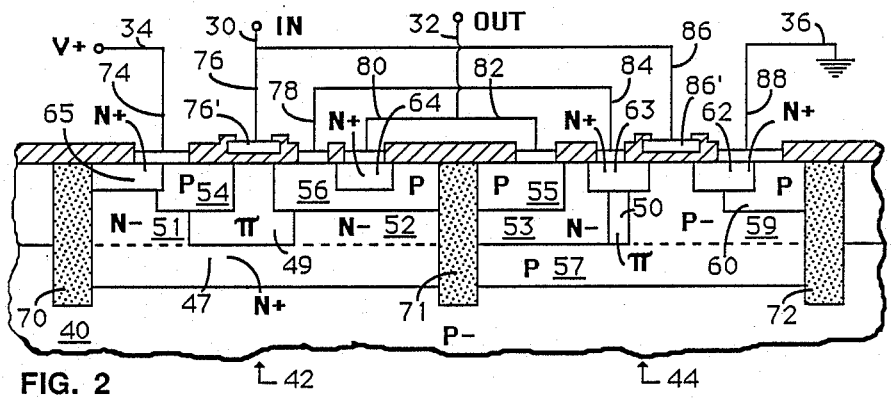
FIG. 2 shows a simplified cross-section through a portion of a semiconductor substrate containing the single input CBICMOS circuit of FIG. 1A, according to the present invention.

FIG. 2 is a simplified cross-section of a portion of a semiconductor wafer or chip, according to the present invention, showing how various device regions are provided to implement circuit 20 of FIG. 1A. Substrate 40 of, for example $P^{31}$ silicon or other semiconductor, has first region 42 and second region 44 surrounded and separated by lateral isolation walls 70-72. Isolation walls 70-72 provide lateral electrical isolation of regions 42 and 44 from the remainder of substrate 40. While substrate 40 is conveniently a single crystal wafer, this is not essential. It is only necessary that regions 42, 44 be of sufficient crystalline quality to permit active devices to be constructed therein, and the remainder of substrate 40 may be of any material. Isolation walls or means 70-72 are conveniently of dielectric but that is not essential and, as used herein, the words "isolation wall" or "isolation means" are intended to include any isolation means, including air gaps and junctions, for laterally isolating regions 42, 44 (and the device regions contained therein) from each other and other interfering device regions which might be in close proximity in or on substrate 40 laterally outside regions 42, 44.

In region 42, P⁻ substrate 40 has therein N⁺ region 47 which is spaced from the device surface. N⁺ region 47 serves as a buried collector contact for NPN transistor 26, formed by regions 64 (emitter), 56 (base) and 52 (collector). The portion of device region 42 above buried layer 47 is composed of N⁻ regions 51, 52 which are optionally separated by substantially intrinsic (Pi) region 49. N⁻ regions 51, 52 may intersect. P regions 54, 56 are provided extending into Pi region 49 and N⁻ regions 51, 52. P regions 54, 56 form the source and drain respectively of P-channel device 22 of FIG. 1A. The P-channel is formed between P regions 54, 56 and under gate 76'. The P-channel may be located either in Pi region 49 or in combined N⁻ region 51, 52 where Pi region 49 is missing, or partly in each. P region 56 also serves as the base of NPN transistor 26. N⁺ regions 64, 65 are provided as shown in region 42. N⁺ region 64 serves as the emitter of NPN transistor 26 and N⁺ region 65 serves as the collector contact for collector 52 of transistor 26. Collector region 52 contacts buried layer 47. N⁻ region 51 connects buried layer 47 and collector contact region 65.

In region 44, P⁻ substrate 40 has thereon P region 57 which is spaced from the device surface. P region 57 functions as the collector and buried layer for bipolar PNP transistor 28, formed by regions 55 (emitter), 53 (base) and 57 (collector). The portion of region 44 above P layer 57 comprises N⁻ region 53, P⁻ region 59 and Pi region 50. While Pi region 50 is illustrated as being present in region 44 between regions 53 and 59, it is not essential. N⁻ region 53 and P⁻ region 59 may directly intersect. N⁻ region 53 serves as the base of PNP transistor 28.

P regions 55, 60 are provided in region 44. P region 55 is located within N⁻ region 53 to function as the emitter of PNP transistor 28 and P regions 60 is located within P⁻ region 59 to function as the collector contact for transistor 28. P⁻ region 59 connects collector contact region 60 to buried layer and collector 57. N+ regions 62, 63 are located at least partially within P⁻ region 59 and function, respectively, as the source and drain of N-channel transistor 24. The N-channel of D transistor 24 extends between N+ source 62, under gate 86' to N+ drain 63.

While regions 46, 47, 52, 53, 55, 56 and 57 are shown as intersecting isolation wall 71, those of skill in the art will appreciate that they may be separated therefrom. However, this increases the area occupied by the resulting structure. Analogously, while region 64 is shown as being separated from isolation wall 71, those of skill in the art will appreciate that the area occupied may be reduced somewhat by allowing region 64 to intersect wall 71. This is because of the reduced alignment tolerance when the mask edges for such regions are located above the isolation wall.

FIG. 2 also illustrates the interconnections which couple the elements provided within regions 42, 44 of substrate 40 so as to implement circuit 20. Lead 74 shorts source region 54 to collector contact 65 and ties them both to power rail 34. Leads 76, 86 connect gates 76', 86' together and to input 30. Leads 78, 84 connect base/drain 56 in region 42 to base/drain 53, 63 in region 44. Leads 80, 82 connect emitters 64 and 55 together and to output 32. Lead 88 shorts source 62 and collector contact 60 and connects them both to ground rail 36. Those of skill in the art will understand that the description of leads 34 and 36 as connecting to power and ground, respectively, is arbitrary since either lead may be used either as the reference or the power lead for electrical purposes with the other serving the opposite function.

Figure 3A:
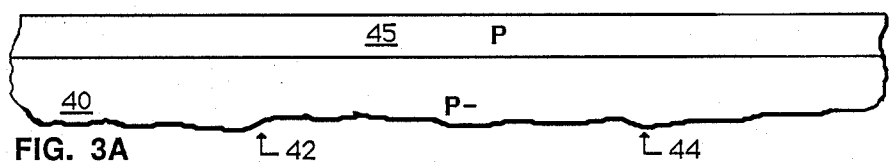
FIGS. 3A-J show simplified cross-sectional views similar to FIG. 2 but at different stages of manufacture.
Figure 3B:
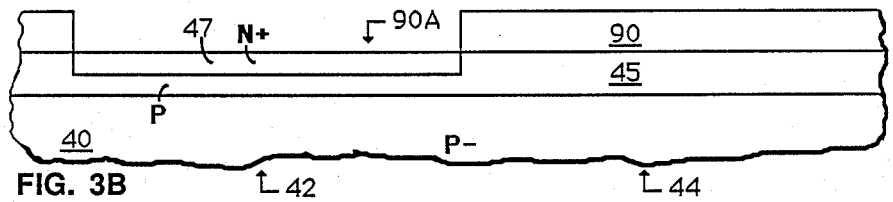
Figure 3C:
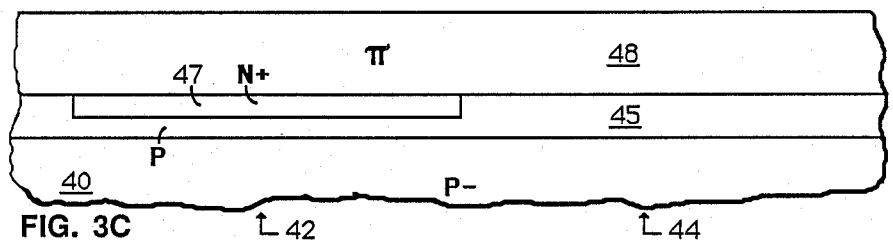
Figure 3D:
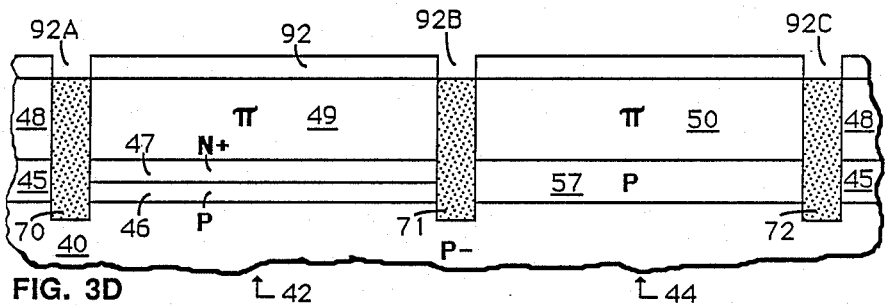
Figure 3E:
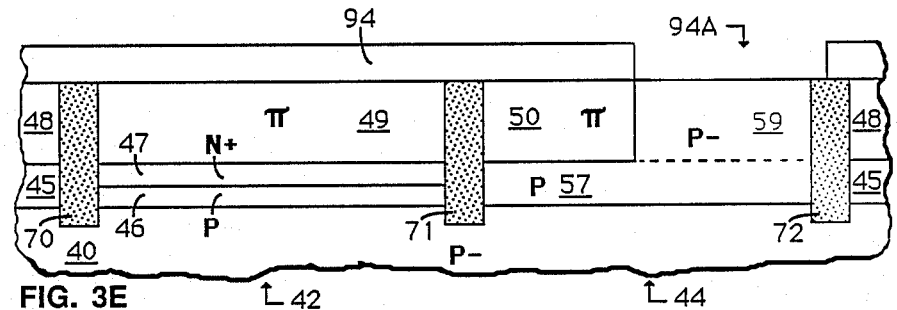
Figure 3F:
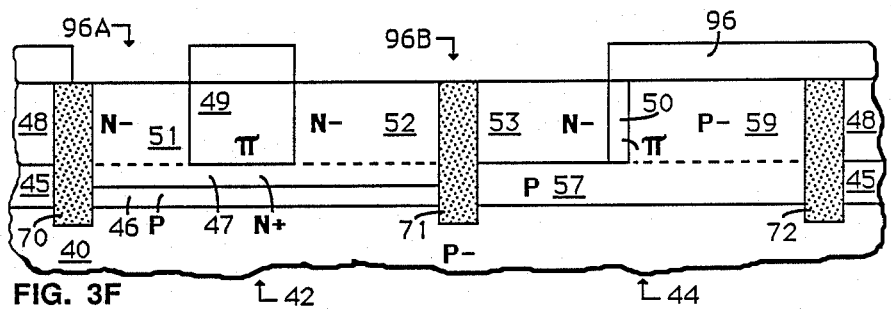
Figure 3G:
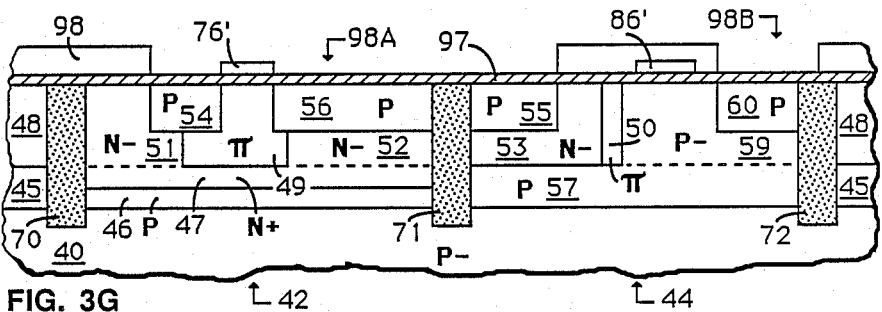
Figure 3H:
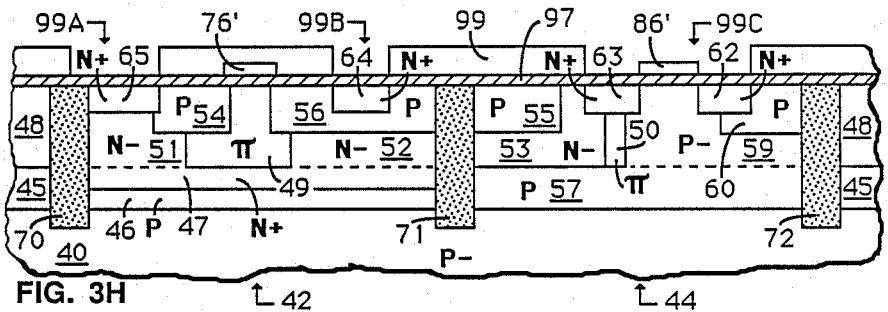
Figure 3I:
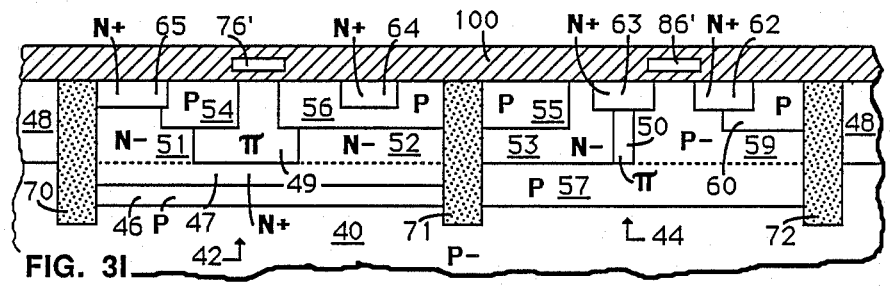
Figure 3J:
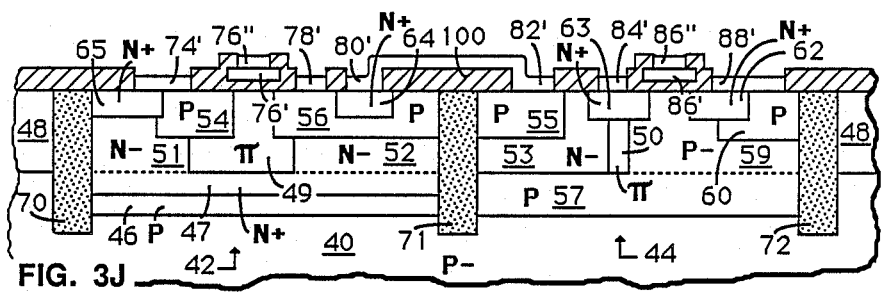
Figure 4:
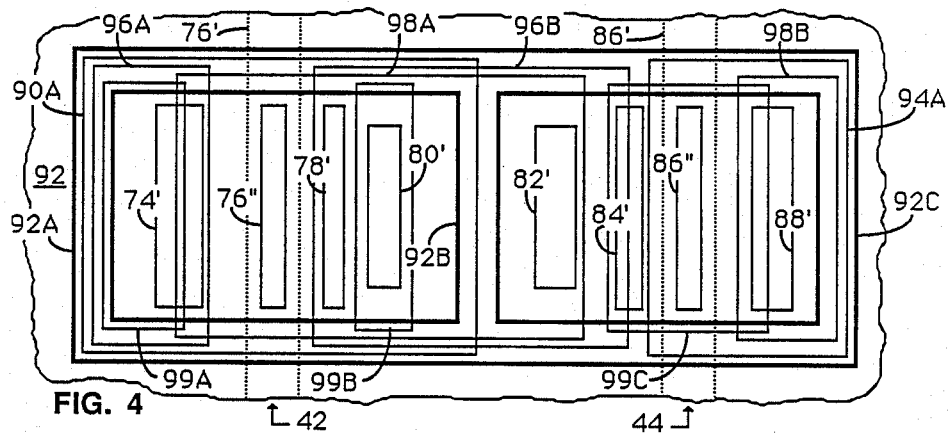
FIG. 4 shows in simplified schematic plan view, a composite of the various mask openings illustrated in cross-section in FIGS. 3A-J.

FIGS. 3A–J in conjunction with FIG. 4 illustrate how the CBICMOS structure and circuit of FIG. 2 is formed according to a first embodiment. FIGS. 3A–J are cross-sections similar to FIG. 2 but at various stages of fabrication. FIG. 4 is a plan view showing the superposition of the mask openings used to fabricate the structure of FIGS. 2 and 3J. These same mask openings are illustrated in cross-section in FIGS. 3A–J. For convenience in understanding FIG. 4, the outlines of isolations walls 70–72 are shown as heavy solid lines and other mask openings are shown as light solid or dotted lines.

Referring now to FIG. 3A, substrate 40 is conveniently provided with P layer 45. While substrate 40 is illustrated as being P⁻, this is convenient but not essential. P layer 45 is formed by epitaxial growth or by thermal diffusion or by ion implantation or a combination thereof. Thermal diffusion has been found to be suitable, but any method may be employed. No masking is required for this step.

Mask 90 with opening 90A is applied and N+ region or buried layer 47 formed through opening 90A (FIGS. 3B and 4). Any suitable means may be employed for forming layer or region 47. Diffusion or ion implantation are both suitable. Mask 90 may be of any masking material commonly used in the art and suitable for masking against the dopant used to form layer 47. Such materials and dopants are well known to those of skill in the art.

Layer 47 is illustrated as being sufficiently thin so as to not extend through layer 45 to contact substrate 40. Portion 46 of layer P layer 45 remains below N+ layer 47, but this is not essential. As shown in FIG. 2. layer 47 may directly contact P⁻ substrate 40. Also, as those of skill in the art will appreciate, based upon the description herein, substrate 40 could be separately doped to form P-type region 57 in substrate 40 in region 44 and N-type region 47 in substrate 40 in region 42 and in either order. This also gives the the arrangement illustrated in FIG. 2. However, this is less convenient than the procedure described above. It is only important that there be an N-type buried layer in region 42 and a P-type buried layer in region 44 to reduce collector contact resistance in these regions. This also permits the collector contacts to be located laterally at the opposite ends of the isolated regions from the emitters. This makes for a compact layout.

Mask 90 is removed and semiconductor layer 48 formed on substrate 40 above buried layers 47, 57 (FIG. 3C). Layer 48 is desirably substantially an intrinsic layer or lightly doped N type, e.g., N⁻. FIGS. 2, 3D-J and 6B show the arrangement where layer 48 is substantially intrinsic, referred to herein as a "Pi" layer, that is, initially formed without a significant amount of a conductivity altering dopant. Since some conductivity altering dopant may be unavoidable, even though in very small amount, it is more accurate to say that, when layer 48 is intended to be intrinsic, the amount of conductivity altering dopant in layer 48 (and in regions 49, 50 formed therefrom, e.g., see FIG. 2) should be sufficiently low so that Pi layer 48 (and regions 59, 50) have a lower dopant concentration than buried layers 47, 57 already formed below layer 48 and than regions 51, 52, 53 and 59 which will be subsequently formed in portions 49, 50 of layer 48 (FIG. 2). FIG. 3K illustrates the situation where layer 48 is N⁻. In that case, layer 48 should be more lightly doped than regions 47, 59, 54–56, and 62–65.

Isolation walls 70, 71, 72 are provided, as indicated in FIGS. 3D and 4, using mask 92 with openings 92A–C. Mask openings 92A–C are shown as heavy solid lines in FIG. 4. While it is convenient to form isolation walls 70–72 at this point, they may usefully be formed anytime after formation of epi-layer 48 (FIG. 3C).

Isolation walls 70–72 are conveniently formed by means well known in the art, such as for example, etch-out and dielectric refill. Any suitable technique may be used. Isolation walls 70–72 divide layer 45 into portion 46 in region 42 and portion 57 in region 44, and divide Pi layer 48 into portion 49 in region 42 and portion 50 in region 44. It is desirable that isolation walls 70–72 penetrate from the surface at least into P layer 45 and may penetrate through P layer 45 into substrate 40. Stopping isolation walls 70–72 in P layer 45 is advantageous in that it obviates the need for providing channel-stops under isolation walls 70–72 as may be necessary where they penetrate through layer 45 into more lightly doped substrate 40.

Mask 94 having opening 94A is applied (FIGS. 3E and 4). P− region 59 is formed in region 50 of layer 48 in region 44 in contact with P layer 57. Ion implantation is a preferred method, but any suitable doping technique will serve. Region 42 remains covered and protected from the dopant used to form region 59.

When layer 48 is intrinsic, mask 96 having openings 96A-B is applied and used in connection with doping means well known in the art to provide N− regions 51, 52 and region 53 in layer 48 in regions 42 and 44, respectively (see FIGS. 3F and 4). Ion implantation is a preferred doping method but other doping methods well known in the art may also be used. It is desirable that regions 51, 52, 53 be formed simultaneously during a single doping step and using a single mask with multiple openings.

When layer 48 is N−, mask layer 96 is not necessary. Pi regions 49, 50 do not exist. N− regions 51, 52 run together and are merely the portion of layer 48 in region 42. N− region 53 is merely the portion of layer 48 remaining in region 44 after formation of P− region 59.

The steps illustrated in FIGS. 3E and 3F may be performed in either order.

It is important following the step of FIGS. 3E or 3F that dielectric layer 97 be present on the surface of the structure in locations that will underlie gates 76', 86' (FIGS. 3G and 4). Dielectric layer 97 may be formed anytime after the completion of layer 48 or just prior to formation of gates 76' and 86'. Although layer 97 is shown as continuously covering the surface this is not essential. Layer 97 is intended to form the gate dielectric of the MOSFETS and only need be present in the regions where the gates are to be formed. It may also be present elsewhere, but this is not essential. Layer 97 under gates 76', 86' is typically in the thickness range 0.01–0.1 micrometers with 0.016, 0.025, and 0.04 micrometers being typical values. Generally, thinner gate dielectrics are used with finer linewidth devices.

Gates 76' and 86' are formed by means well known in the art. Polysilicon is a convenient material for gates 76', 86' but any conductive material able to withstand subsequent processing steps may be used. Examples of other suitable materials are metals and intermetallics and especially conductive silicides and nitrides. Gates 76' and 86' are conveniently formed by depositing a substantially uniform conductor layer and then by means of a mask, etching away the surrounding material except for portions 76', 86'. The mask outline for producing gates 76' and 86' is shown as a dotted line in FIG. 4. Gates 76' and 86' may extend beyond isolation walls 70-72, as indicated in FIG. 4, but this is not essential. Gates 76', 86' should be thick enough to act as a mask for some subsequent doping steps, as explained below. Thicknesses in the range 0.2 to 0.5 micrometers are suitable with about 0.35 micrometers preferred, but other thicknesses can also be used depending upon the conductance and masking ability required. Those of skill in the art will understand how to vary the thickness.

Mask 98 having openings 98A-B is applied after gates 76', 86' are formed and in place above dielectric 97 (FIGS. 3G and 4). Using the combination of openings 98A-B and the blockage provided by gates 76' and 86', P regions 54, 56 are provided in region 42 and P regions 55, 60 are provided in region 44. It is desirable that all four regions 54, 55, 56, 60 be provided simultaneously in one masking and doping step. Ion implantation is the preferred method for forming regions 54, 55, 56, and 60, but other methods well known in the art may also be used.

Mask 99 having openings 99A-C is applied (FIGS. 3H and 4) and N+ doped regions 62, 63 formed in region 44 and N+ doped regions 64, 65 formed in region 42, preferably simultaneously. Ion implantation is the preferred doping method but other methods well known in the art may also be used. At this point, other than for activation steps, the internal device regions of the CBICMOS structure and circuit are finished.

Dielectric layer 100 is provided (FIG. 3I) by any means well known in the art and may be made up of several layers or regions formed during earlier stages of the process and left behind after previous masking operation. Layer 100 passivates the surface and electrically insulates the interconnections from the semiconductor except where contact is desired. It should be sufficiently thick and of a material suitable for those purposes. Such materials are well known in the art. For example, thicknesses in the range of 0.4 to 1.0 micrometers of deposited oxide or glass are suitable with about 0.6 micrometers preferred, but thicker or thinner layers can also be used as long as the conductors used for coupling various device portions are insulated from the substrate except where connection is desired.

Figure 3K:
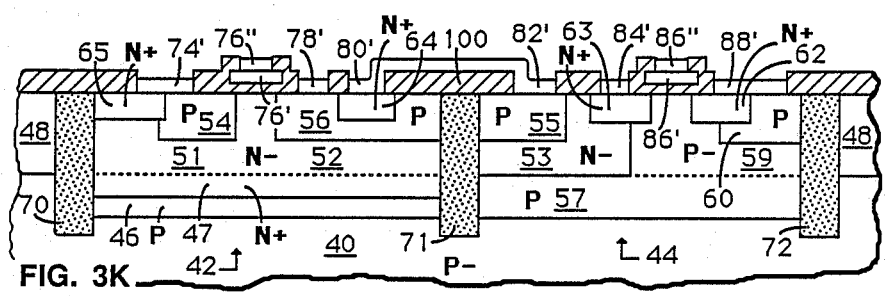
FIG. 3K is a cross-sectional view similar to FIG. 3J but according to another embodiment of the present invention.

Contact openings and conductive contacts 74', 76", 78' 80' 82', 84', 86" and 88' are provided as shown in FIGS. 3J and 4 to make contact to the various doped regions of the structure. It is desirable that the contact metallization also interconnect the device elements to implement the desired circuit. As used herein, the words "metal" and "metalization" are intended to refer generally to conductive materials, including for example, semiconductors, intermetallics and composites, and not be limited merely to metals. The metallization may be a single material or a composite. Further, a multilayered arrangement may be used, for example, where a first metal is desired for making contact to the various semiconductor regions and another superposed metal is desired for interconnecting the semiconductor regions to form the desired circuit.

FIG. 3K shows a cross-sectional view similar to FIG. 3J except that layer 48 is initially N− rather than intrinsic. Pi regions 49, 50 are absent. N− regions 51 and 52 run together and represent the portion of N− layer 48 between isolation walls 70-71 in region 42. N− region 53 represents the portion of layer 48 between isolation walls 71-72 which has not been counter-doped to form P− region 59. Those of skill in the art will understand based on the description herein that the fabrication sequence for forming the structure of FIG. 3K is the same as for FIGS. 3A-J except that since layer 48 and regions 51, 52, 53 are already N−, mask 96 with openings 96A-B is not essential and may be omitted. However, if it is desired to enhance the conductivity of regions 51, 52, 53, then mask 96 and the corresponding N doping step may be retained.

Figure 5A:
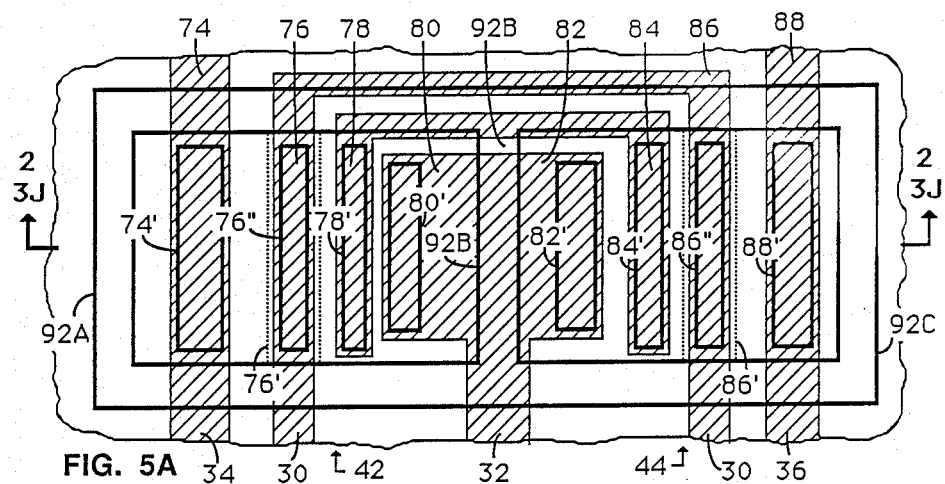
FIGS. 5A-B are plan views similar to FIG. 4 but further simplified and showing the conductors used for interconnecting various regions of the device cross-section of FIGS. 2 and 3J-K, and according to two embodiments of the present invention.
Figure 5B:
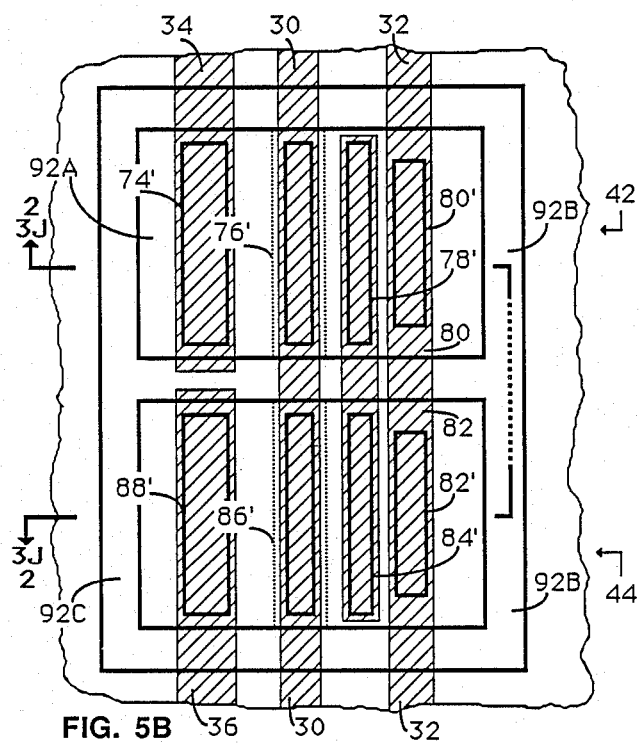

FIGS. 5A-B. show plan views of two device topologies and metallization arrangements for accomplishing circuit 20 according to different embodiments of the present invention. FIGS. 5A-B are similar to FIG. 4, but for simplicity, only the mask openings for the isolations walls (heavy solid lines), the gates (dotted lines) and the contact openings (heavy solid lines) are shown. The same identification numbers are used in FIGS. 5A-B as in previous figures for the same regions or connections so that the various parts of FIGS. 5A-B may be correlated with the device regions and connections shown in cross-section in FIGS. 2 and 3J-K. The hatched regions on FIGS. 5A-B show the topology of the interconnections (depicted schematically in FIG. 2) for implementing circuit 20 from the device elements in FIGS. 2 and 3J-K.

FIG. 5A corresponds exactly to the arrangement of FIGS. 2 and 3J in that regions 42 and 44 in FIG. 5A are arranged side-by-side in the same manner as indicated in FIGS. 2 and 3J. The hatched interconnections of FIG. 5A show that circuit 20 may be implemented using a single metal layer with all connections being available on a single edge of the structure (e.g., lower side in FIG. 5A) and some available on both edges, e.g., rails 34, 36. In FIG. 5A, rails 34, 36 and corresponding contact regions 74', 88' are located at opposite (e.g., left and right) ends of the CBICMOS structure.

FIG. 5B shows another embodiment in which region 44 has been rotated one hundred and eighty degrees and placed alongside region 42 so that contact regions 74' and 88', contact regions 78' and 84', contact regions 80' and 82', and gates 76' and 86' line up and are adjacent across the intervening isolation wall. This provides a compact structure with further wiring flexibility, as indicated by the hatched regions. Input and output now run continuously across the structure so as to be available from either top or bottom.

When laying out a complex integrated circuit, the arrangements of FIGS. 5A-B may be used alternatively depending upon which leads (i.e., power and ground, or input and output) are desired to be available in which edge locations and/or which are desired to run continuously through the structure. This flexibility permits particularly compact complex circuits to be realized using the merged CBICMOS arrangement and process of the present invention.

Figure 6A:
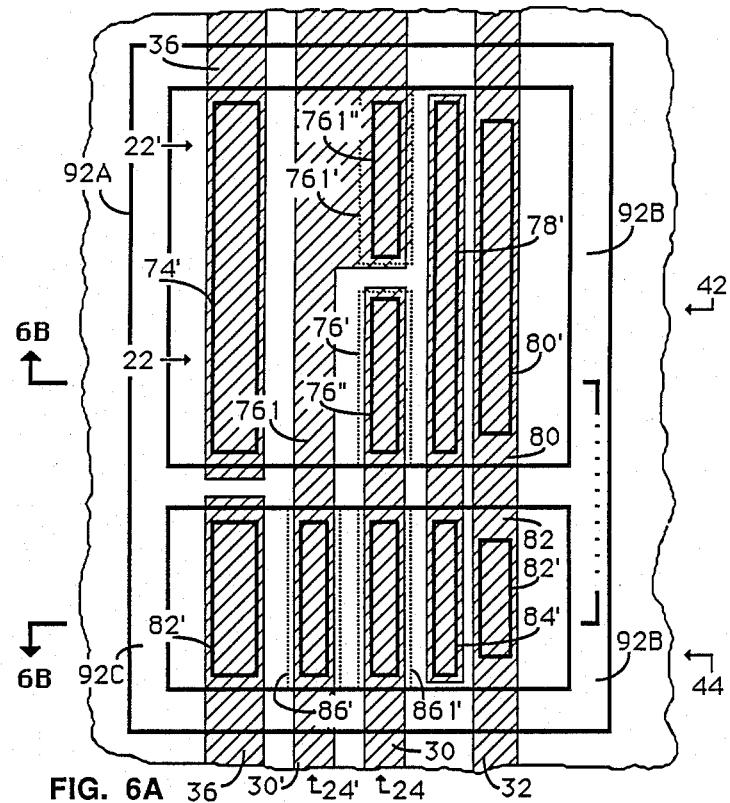
FIG. 6A is a plan view similar to that of FIG. 5B.
Figure 6B:
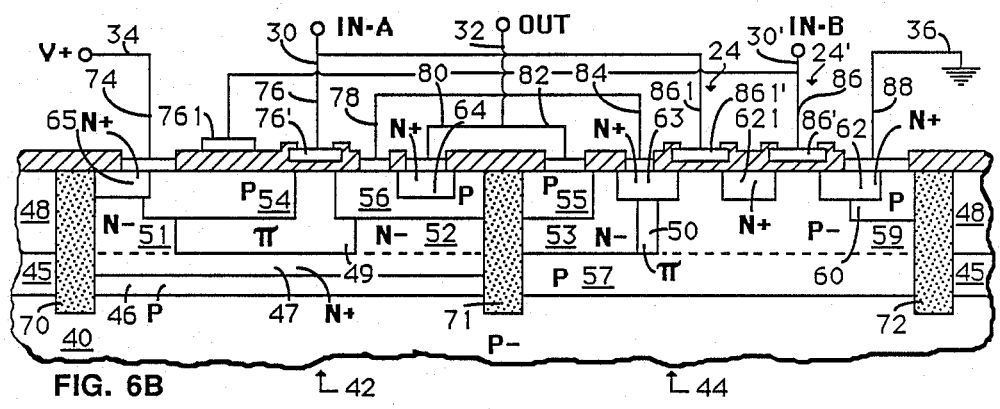
FIG. 6B is a cross-section similar to FIG. 2, but for a dual input CBICMOS circuit according to a further embodiment of the present invention.

FIGS. 6A-B show a further embodiment of the present invention in which a two input circuit is illustrated, e.g., a NOR gate. Those of skill in the art will understand, based on the description here, how the principles of the present invention may be employed to implement circuits having any number of inputs and outputs and providing a variety of logic functions.

FIG. 6A is similar in representation to FIG. 5B and FIG. 6B is similar in representation to FIGS. 2 and 3J-K, but implementing circuit 20' of FIG. 1B. The same numbers have been used to indicate similar regions. FIGS. 6A-B differ from FIGS. 5B and 2, 3J-K in that additional transistors 22' and 24' have been provided and interconnected as shown in FIG. 1B.

Transistor 22' is in parallel with transistor 22. It is implemented by providing additional gate 761' and gate contact 761", analogous to gate 76' and gate contact 76", located in region 42 as shown in FIG. 6A. The source and drain regions of transistor 22' associated with gate 761' are common with source and drain regions 54, 56 for gate 76', located behind regions 54, 56 in FIG. 6B and extending vertically alongside gate 761' in FIG. 6A.

Transistor 24' is in series with transistor 22. It is implemented by providing additional N+ region 621, formed at the same time as region 62, in region 44 as shown in FIGS. 6A-B, and separated from regions 62 and 63 by portions of P region 59. Region 62 serves as the source of transistor 24, region 621 serves as the drain of transistor 24 and source of transistor 24' and region 63 serves as the drain of transistor 24'. Additional gate 861' is also provided as shown in FIGS. 6A-B.

FIGS. 6A-B show how the various device regions are interconnected to implement circuit 20' in a single metallization layer. No additional process steps are required to provide the device regions and interconnections for circuit 20'. Circuit 20' is implemented in FIGS. 6A-B using the same device merging arrangements of FIGS. 2, 3J-K and 5A-B for circuit 20. A particularly compact structure with flexible wiring capabilities is obtained. Those of skill in the art will understand that these principles may be used to provide compact merged CBICMOS structures for other circuits.

Further processing steps may be added to refine the device characteristics. For example, the channel regions under the gates may be doped by implantation or otherwise to adjust the threshold of the N and P channel transistors to have the desired values. Means for performing such doping are well known in the art.

Typical layer dimensions and device region characteristics are illustrated as follows. Layer 45 and region 57 desirably have sheet resistance in the range 50-500 ohms per square with about 200 ohms per square being preferred. Other sheet resistance values can be used for layer 45 and region 57. For example, if it is desired to increase the doping in region 57 above that provided by P layer 45, this can be accomplished, for example, by a masked implant into the location of region 44 prior to forming epi-layer 48.

Layer 48 conveniently has a thickness in the range of about 0.8 to 3.0 micrometers with about 1.2 micrometers thickness being preferred. However, other thicknesses can also be used for layer 48. Layer 48 is preferably intrinsic (i.e., substantially free of conductivity altering dopants as deposited) or $N^-$. When layer 48 is $N^-$, no doping or masking step is required for regions 51, 52, and 53, since they are provided automatically by layer 48. Pi regions 49, 50 do not exist in that situation. The N doping of layer 48 is light so that $P^-$ region 59 may be formed, for example, by counter doping. Using $N^-$ epi for layer 48 eliminates the need for mask 96 (FIGS. 3F and 4). The resulting structure is illustrated in FIG. 3K. However, if it is desired to enhance the doping in regions 51, 52, 53, mask 96 may be retained.

For a structure with region 57 of about 200 ohms per square P type and layer 48 of about 1.2 micrometers of substantially intrinsic material, then region 47 desirably has a sheet resistance in the range 30-80 ohms per square N type, typically about 40 ohms per square, and regions 51, 52, 53 and 59 have about the same thickness as layer 48. Regions 54, 55, 56 and 60 are about 0.2-0.6 micrometers deep from the surface with about 0.4 micrometers being typical. Regions 62, 63, 64 and 65 are about 0.1-0.5 micrometers deep from the surface with about 0.2 micrometers being typical.

The basewidth of the PNP device is controlled by the difference in thickness between region 53 and region 55, and the basewidth of the NPN device is controlled by the difference in thickness of regions 56 and 64. Persons of skill in the art will understand how these basewidths should be adjusted to obtain the desired device characteristics.

Lateral device dimensions are generally limited by the smallest resolvable linewidths and the mask to mask alignment tolerances. Generally, gates 76', 86' and contact openings 78', 80', 82', and 84' will be minimum width and separation and are all on a single mask. This permits a compact structure. Typical minimum mask opening widths and spacings are conveniently in the range of about 0.5 to 2.0 micrometers with about 1.0 micrometers being typical of the capabilities of current optical lithography tools. However, smaller openings and spacings may be realized using E-beam and X-ray techniques. Those of skill in the art will understand, based on the teachings herein, how to adjust the mask openings and spacings for the various device regions to minimize overall area. Where gates 76' and 86' are minimum width openings then gate contact openings 76" and 86" will be of the same or greater width, i.e. wider than shown in FIGS. 3J–K, 5A–B. and 6A.

Having described the invention it will be apparent to those of skill in the art that the present invention provides improved means and method for forming CBIC-MOS devices on a common substrate by a common series of process steps and masks having great flexibility, that the resulting structures are very compact and internally isolated so that undesirable interactions between the N and P type devices are avoided without sacrificing overall circuit performance.

Further, based on the description provided herein, the invented means and method may be applied to a wide variety of semiconductor materials and substrates and still provide the combination of N and P regions required to implement a great variety of merged CBIC-MOS circuits, and that such variations will, based on the teachings herein, be apparent to those of skill in the art. Accordingly, it is intended to include these and other variations as will occur to those of skill in the art based on the teachings herein in the claims which follow.

I claim:

1. A method for forming semiconductor device structures comprising:
 providing a substrate having therein first and second semiconductor regions laterally separated by an isolation means and extending to a principal surface, wherein the first region has a first portion of a first conductivity type separated from the first surface and the second region has a first portion of a second conductivity type opposite the first type separated from the surface;
 then in either order the steps of (i) forming in the second region a second portion of the second type contacting the first portion of the second region and extending to the surface, and (ii) providing, in the first region, second and third portions of the first type in contact with the first portion of the first region and extending to the surface and spaced apart by a part of the first region and, in the second region, a third portion of the first type in contact with the first portion of the second region and extending to the surface;
 forming in both the first and second regions, fourth and fifth spaced apart portions of the second type extending to the surface wherein the fifth portion of each region is separated from the first portion of each region by part of the third portion of each region;
 forming in both the first and second regions, sixth and seventh spaced apart portions of the first type extending to the surface, wherein in the second region the sixth and seventh portions extend into the second portion of the second region and are separated by some of the second portion of the second region; and
 providing above the surface a first conductor interconnecting the fifth portion of the first region and the seventh portion of the second region and a second conductor interconnecting the fifth portion of the second region and the seventh portion of the first region.

2. The method of claim 1 wherein the steps of forming the second and third portions of the first type in the first region and forming the third region of the first type in the second region are performed simultaneously.

3. The method of claim 2 wherein the steps of forming the fourth and fifth portions in the first and second regions are performed simultaneously.

4. The method of claim 3 wherein the steps of forming the sixth and seventh portions in the first and second regions are performed simultaneously.

5. The method of claim 1 wherein the step of providing the substrate comprises, providing a substrate having a primal surface, doping the primal surface with a dopant of the second type to a first concentration, covering the doped primal surface with a mask having an opening corresponding to the location of the first region, counter doping the primal surface of the substrate exposed through the opening with a dopant of the first type to form the first portion of the first region, forming an epitaxial semiconductor layer on the primal surface wherein the outer surface of the epitaxial semiconductor layer forms the principal surface of the substrate.

6. The method of claim 1 wherein the step of providing the substrate comprises, providing a substrate having a primal surface, covering the primal surface with a first mask having an opening corresponding to the first region, then in either order (a) providing a first opening in the mask corresponding to the first region of the substrate and doping the primal surface of the substrate exposed through the first opening with a dopant of the first type to form the first portion of the first region, and (b) providing a second opening not including the first opening and doping the primal surface of the substrate through the second opening with a dopant of the second type to form the first portion of the second region, and thereafter covering the primal surface with a layer of semiconductor having an outer surface corresponding to the principal surface of the substrate.

7. The method of claim 6 further comprising, before or after said doping steps, forming an isolation wall comprising a dielectric and extending laterally between the first and second regions of the substrate.

8. The method of claim 1, prior to the step of providing the fourth and fifth portions of the first and second regions, forming a first gate dielectric on the surface above the part of the first region and a second gate dielectric above the second portion of the second region and then forming a first gate above the first gate dielectric and a second gate above the second gate dielectric.

9. The method of claim 8, wherein the step of forming the spaced apart fourth and fifth portions of the second region comprise doping the fourth and fifth portions of the second region using the second gate as a mask, and wherein the step of forming the spaced apart sixth and seventh portions of the first region comprise doping the sixth and seventh portions of the first region using the first gate as a mask.

10. The method of claim 1 wherein the steps of providing a substrate and providing the second and third portions of the first region and the third portion of the second region are accomplished by providing a single crystal substrate, forming an epi-layer of the first type on the single crystal substrate, dividing the epi-layer into first and second semiconductor regions separated by the isolation means extending to the principal surface, wherein the single crystal substrate includes the first portion of the first conductivity type under the first region and the first portion of the second conductivity type under the second region and wherein the first region includes the second and third portions of the first region of the same type as the epi-layer and the second region includes the third portion of the second region of the same type as the epi-layer.

11. A method for forming merged CBICMOS device structures, comprising:

providing a substrate having two predetermined semiconductor zones in a principal surface;

forming a first N-doped portion in the first zone and a first P-doped portion in the second zone, extending to the principal surface;

forming an epi-layer on the principal surface above the first and second zones, the epi-layer having an outer surface spaced from the principal surface and first and second regions respectively overlying the first and second zones of the substrate;

forming an isolation wall separating the first and second regions and extending from the outer surface at least through the epi-layer to the substrate;

P-doping a second portion of the second region extending to the first P-doped portion of the second zone;

N-doping second and third spaced apart portions of the first region extending to the first N-doped portion of the first zone;

N-doping a third portion of the second region substantially separate from the second P-doped portion of the second region;

providing a first insulated gate over the first region and a second insulated gate over the second region;

P-doping fourth and fifth spaced apart portions of the second region, extending to the outer surface, and, using the first insulated gate as a separation mask, P-doping fourth and fifth separated portions of the first region extending to the outer surface, wherein the P-doped fourth and fifth portions of the first region are separated by a part of the epi-layer in the first region and the P-doped fourth portion of the second region is located in the P-doped second portion of the second region and the P-doped fifth portion of the second region contacts the N-doped third portion of the second region;

N-doping sixth and seventh spaced apart portions of the first region and, using the second gate as a separation mask, N-doping sixth and seventh separated portions of the second region, wherein the N-doped sixth portion of the first region contacts the N-doped second portion of the first region, the N-doped seventh portion of the first region is located in the P-doped fifth portion of the first region, the N-doped sixth portion of the second region is located in the P-doped second portion of the second region and the N-doped seventh portion of the second region is in contact with both the P-doped second portion and the N-doped third portion of the second region; and interconnecting the fourth and sixth portrons of the first region, interconnecting the fourth and sixth portions of the second region, interconnecting the fifth portion of the first region and the seventh portion of the second region, interconnecting the fifth portion of the second region and the seventh portion of the first region, and interconnecting the first gate and the second gate.

12. The method of claim 11 wherein the step of doping the fourth and fifth portions of the first and second regions comprises doping the fourth and fifth portions of the first and second regions simultaneously.

13. The method of claim 11 wherein the step of doping the sixth and seventh portions of the first and second regions comprises doping the sixth and seventh portions of the first and second regions simultaneously.

14. The method of claim 11 wherein the step of forming the epi-layer comprises forming a substantially intrinsic epi-layer.

15. The method of claim 11 wherein the steps of N-doping the second and third portions of the first region and N-doping the third portion of the second region are performed substantially simultaneously.

16. A method for forming merged CBICMOS device structures, comprising:

providing a substrate having two predetermined semiconductor zones in a principal surface;

forming a first N-doped portion in the first zone and a first P-doped portion in the second zone, extending to the principal surface;

forming an N-type epi-layer on the principal surface above the first and second zones, the epi-layer having an outer surface spaced from the principal surface and first and second regions respectively overlying the first and second zones of the substrate;

forming an isolation wall separating the first and second regions and extending from the outer surface at least through the epi-layer to the substrate;

P-doping a second portion of the second region extending to the first P-doped portion of the second zone, leaving a third portion of the second region and second and third portions of the first region N-type;

providing a first insulated gate over the first region and a second insulated gate over the second region;

P-doping third and fourth spaced apart portions of the second region, extending to the outer surface, and, using the first insulated gate as a separation mask, P-doping fourth and fifth separated portions of the first region extending to the outer surface, wherein the P-doped fourth and fifth portions of the first region are separated by a part of the epi-layer in the first region and the P-doped fourth portion of the second region is located in the P-doped second portion of the second region and the P-doped fifth portion of the second region contacts the N-type third portion of the second region;

N-doping sixth and seventh spaced apart portions of the first region and, using the second gate as a separation mask, N-doping sixth and seventh separated portions of the second region, wherein the N-doped sixth portion of the first region contacts the N-type second portion of the first region, the N-doped seventh portion of the first region is located in the P-doped fifth portion of the first region, the N-doped sixth portion of the second region is located in the P-doped second portion of the second region and the N-doped seventh portion of the second region is in contact with both the P-doped second portion and the N-type third portion of the second region; and at the same time, interconnecting the fourth and sixth portions of the first region, interconnecting the fourth and sixth portions of the second region, interconnecting the fifth portion of the first region and the seventh portion of the second region, interconnecting the fifth portion of the second region and the seventh portion of the first region, and interconnecting the first gate and the second gate.

* * * * *